United States Patent [19]

Koike

[11] Patent Number: 5,670,802

[45] Date of Patent: Sep. 23, 1997

[54] SEMICONDUCTOR DEVICE

[75] Inventor: Tsuneo Koike, Tokyo, Japan

[73] Assignee: NEC Corporation, Tokyo, Japan

[21] Appl. No.: 621,194

[22] Filed: Mar. 21, 1996

[30] Foreign Application Priority Data

Mar. 30, 1995 [JP] Japan .................................. 7-072812

[51] Int. Cl.$^6$ ................................................. H01L 27/10
[52] U.S. Cl. ........................... 257/207; 257/203; 257/208
[58] Field of Search ................................... 257/207, 786, 257/691, 692, 676, 686, 670, 672, 203, 208, 690

[56] References Cited

U.S. PATENT DOCUMENTS

| 5,083,181 | 1/1992 | Yoshida et al. | 257/207 |
| 5,184,208 | 2/1993 | Sakuta et al. | 257/666 |
| 5,331,201 | 7/1994 | Nishino | 257/666 |
| 5,442,233 | 8/1995 | Anjoh et al. | 257/691 |
| 5,473,198 | 12/1995 | Hagiya et al. | 257/786 |
| 5,534,729 | 7/1996 | Russell | 257/691 |
| 5,545,920 | 8/1996 | Russell | 257/784 |
| 5,567,655 | 10/1996 | Rostoker et al. | 257/692 |

FOREIGN PATENT DOCUMENTS

| 0116927 | 8/1984 | European Pat. Off. | 257/786 |
| 55-117251 | 9/1980 | Japan . | |
| 59-27539 | 2/1984 | Japan | 257/786 |
| 61-214532 | 9/1986 | Japan . | |
| 63-93125 | 4/1988 | Japan | 257/786 |
| 2-159759 | 6/1990 | Japan . | |

*Primary Examiner*—Sara W. Crane
*Assistant Examiner*—Phat X. Cao
*Attorney, Agent, or Firm*—Sughrue, Mion, Zinn, Macpeak and Seas

[57] ABSTRACT

The invention provides a semiconductor device in the form of an LSI circuit having a large number of terminals wherein an increase of the number of pad terminals for a power source potential and wherein a ground potential does not increase the inductances of wiring lines to the pad terminals and the terminals are arranged efficiently. The semiconductor device includes a semiconductor chip having a semiconductor substrate on which a first pad arrangement region, a buffer arrangement region and a second pad arrangement region are successively assured in this order toward the outer side around an internal circuit formation region and arranged in parallel to each other. A first power source pad and a first grounding pad for an internal circuit are provided in the first pad arrangement region while a plurality of pads for inputting and/or outputting signals are provided in the second pad region. The pads are bonding connected by respective thin metal lines to external lead terminals provided on a support.

5 Claims, 11 Drawing Sheets

SEMICONDUCTOR DEVICE

BACKGROUND OF THE INVENTION

1. Field of the Invention

This invention relates to a semiconductor device, and more particularly to an arrangement of wiring lines for a power source terminal and a grounding terminal of a semiconductor device.

2. Description the Related Art

In recent years, as an increase in the degree of integration and in the number of functions of a semiconductor device (hereinafter referred to as LSI) proceeds, an increase in the number of input and/or output terminals proceeds. For example, some IC chips of 10 to 15 mm squared have 300 to 600 input and/or output terminals. In order to mount an IC chip of the type mentioned, a DIP (Dual In-line Package) is normally used as a standard package. However, from restrictions in the number of terminals, mounting method, strength, price and so forth, it is sometimes difficult to mount an IC chip on a DIP. To eliminate the difficulty, various mounting methods which employ various resin-encapsulated packages or ceramic case type packages have been developed. Also it is getting difficult to arrange pads of a semiconductor chip, which are to be connected to those external terminals, on an outer periphery of the chip.

One of solutions to those problems is disclosed in Japanese Patent Laid-Open Application No. Showa 55-117251. In order to facilitate understanding of the semiconductor device disclosed in the document just mentioned in contrast with semiconductor devices of preferred embodiments of the present invention which will be hereinafter described, a principal portion of the semiconductor device is shown in a somewhat modified form in FIGS. 5(a) and 5(b) which are a schematic plan view and a schematic sectional view, respectively, of the semiconductor device. Referring to FIGS. 5(a) and 5(b), in the semiconductor device shown, a semiconductor chip 11 is mounted on a support 10 and has, at a central portion thereof, an internal circuit region in which an internal circuit 12 is disposed. The semiconductor chip 11 further has, on the outer side of the internal circuit region thereof, a buffer arrangement region in which buffers 14a to 14c for signals to be inputted and outputted are arranged and, above the buffers 14a to 14c, a power source wiring line ring 15a formed from a first conductive layer for supplying a power source potential to the buffers 14a to 14c and a grounding wiring line ring 15b for supplying a ground potential to the buffers 14a to 14c. The buffers 14a to 14c are connected to the power source wiring line ring 15a and the grounding wiring line ring 15b through via-holes by contacts 16 (each indicated by the mark x in FIG. 5(a)).

The semiconductor chip 11 further has, on the outer side of the buffer arrangement region, a pad arrangement region in which pads 13e to 13k to which input and/or output terminals for the power source potential, the ground potential and the buffers are arranged In a zigzag pattern in two rows. The pads 13e to 13g and the buffers 14a to 14c are connected to each other by wiring lines 17e to 17g formed from a second conductive layer, respectively, and the outputs of the buffers 14a to 14c are connected to the internal circuit 12 similarly by wiring lines of the second conductive layer.

The power source pads 13h and 13j and the grounding pads 13i and 13k are connected to the internal circuit 12 by wiring lines 17h, 17g, 17i and 17j of the second conductive layer, respectively, crossing above the buffers. At the locations where the wiring lines 17g to 17j cross above the buffers, the buffers 14a to 14c are connected to the power source wiring line ring 15a and the grounding wiring line ring 15b through via-holes by the contacts 16.

Further, on the outside of the semiconductor chip 11, external lead terminals 19a to 19g are disposed on an end face of a recessed portion 18 opened to the support 10 as shown in FIG. 5(b). Of the external lead terminals 19a to 19g, the signal terminals 19a, 19d and 19e are bonding connected to the pads 13e, 13f and 13g, the ground terminals 19b and 19g are bonding connected to the pads 13i and 13k, and the power source terminals 19c and 19f are bonding connected to pads 13h and 13j, respectively, by individual thin metal lines 20.

With the semiconductor device described above, since the pads are arranged in a plurality of rows and in a zigzag pattern, the numbers of pads and leads which can be provided can be increased.

Meanwhile, another semiconductor device which achieves comparatively high speed operation of an LSI is disclosed in Japanese Patent Laid-Open Application No. Heisei 2-159759. A principal portion of the semiconductor device disclosed in the document just mentioned is shown in FIGS. 6(a) and 6(b). Referring to FIGS. 6(a) and 6(b), the semiconductor device shown is different from the former semiconductor device described above in that a buffer region is arranged around an internal circuit region and a pad region is provided on the outer side of the buffer region while a power source wiring line ring 15a and a grounding wiring line ring 15b are arranged in parallel to each other on the outer side of the pad region.

In particular, the power source wiring line ring 15a and the grounding wiring line ring 15b are arranged on an outer periphery of the chip and pads are arranged in a row. Wiring lines 17k and 17l of a second conductive layer extend in two opposite directions from a power source pad 13k and a grounding pad 131, respectively, and one of the two wiring line segments of the second conductive layer wiring line 17k is connected to the internal circuit 12 while the other wiring line segment of the second conductive layer wiring line 17k is connected to a wiring line 15c of a first conductive layer and is further connected to the buffers 14a to 14d in the buffer arrangement region through via-holes by contacts 16.

One of the two wiring line segments of the other second conductive layer wiring line 17l is connected to the internal circuit 12 while the other wiring line segment of the 17l is connected to another wiring line 15d of the second conductive layer and further connected to the buffers 14a to 14d in the buffer arrangement region through via-holes by contacts 16.

While, in the semiconductor device shown in FIGS. 5(a) and 5(b), the floating capacitance between the power source wiring line and the grounding wiring line is high and the operation speed of the buffers is low since the buffers are arranged below the power source wiring line ring 15a and the grounding wiring line ring 15b, in the semiconductor device shown in FIGS. 6(a) and 6(b), the floating capacitance is reduced and the operation speed of the input/output buffers is increased by employment of the construction described above.

A further semiconductor device which also achieves comparatively high speed operation is disclosed in Japanese Patent Laid-Open Application No. Showa 61-214532. A principal portion of the semiconductor device disclosed in the document just mentioned is shown similarly in FIG. 7. Referring to FIG. 7, the semiconductor device is generally different from the two semiconductor devices described above in that a power source pad 13c and a grounding pad 13d connected to a power source wiring line ring 15a and a grounding wiring line ring 15b respectively, are provided independently of a power source pad 13a and a grounding pad 13b connected to an internal circuit 12, respectively. In particular, the power source wiring line ring 15a and the grounding wiring line ring 15b disposed on buffers 14a and 14b are connected through via-holes by contacts 16 to wiring lines 17a and 17b of a second conductive layer wired from the power source pad 13c and the grounding pad 13d, respectively, and are connected also to the buffers 14a and 14b at upper portions of the same through via-holes.

With the semiconductor device of the construction described above, since the power source wiring line and the grounding wiring line for the buffers are formed separately from the power source wiring line and the grounding wiring line for the internal circuit, noise which is produced when the buffers 14a and 14b operate does not have an influence on the internal circuit 12. Consequently, a higher speed operation than those of the two preceding semiconductor devices can be achieved.

As described above, semiconductor devices of the type described have several problems when they are used to realize high speed operation. In particular, where pads are arranged in a zigzag pattern in two rows, a comparatively long distance is required for metal wiring lines for interconnection of inside pads and external lead terminals, and consequently, the wiring lines have a comparatively high self inductance. Where a power source wiring line ring and a grounding wiring line ring are disposed between leads for external connection and pads, a further longer distance is required for metal wiring lines for interconnection between external lead terminals and pads, and naturally, also the wiring lines have a further high self inductance. Due to the self inductance, an overshoot or an undershoot is produced when a signal transmitted by any of the wiring lines rises from the low level to the high level in logic level or when such signal falls from the high level to the low level.

An output buffer from which a signal having an overshoot and an undershoot is outputted undergoes a delay in propagation of the signal caused by the overshoot and the undershoot which exceed input and output threshold voltages of an output transistor.

The signal delay will be described below with reference to a waveform diagram of FIG. 8. FIG. 8 shows waveforms of the semiconductor device of FIGS. 5(a) and 5(b) wherein bonding pads are arranged in two rows on an outer periphery of a semiconductor chip. Referring to FIG. 8, the waveform A is a waveform at the pad 13e as an output signal of the buffer 14a; the waveform B shows a variation of the waveform A at the external lead terminal 19a; the waveform C is a waveform of, for example, +5 V as the power source voltage supplied to the external lead terminal 19c from the outside; and the waveform D shows a variation of the waveform C at the pad 13h.

A signal at the point A in FIG. 5(a) outputted from the buffer 14a rises from the low level to the high level at time t0 and exceeds the threshold voltage of the input buffer of the destination when time Δt1 elapses after time t0. The thus outputted signal, however, propagates in such a condition that the variation of the waveform is settled after time Δt2 in which the overshoot converges like the signal at the point B by the self inductance of the wiring line.

The magnitude of ringings then increases in proportion to the self inductance and the rate of change of the electric current with respect to time. Accordingly, upon switching of an input or output buffer, since a high electric current flows instantaneously, ringings of a large magnitude are produced by the self inductance.

Since electric current flows steadily to some degree through the internal circuit 12, the electric current exhibits a comparatively small variation with respect to time, and accordingly, also ringings produced by the self inductance are small.

Further, upon rising of a signal, electric current flows from the power source side to an output buffer, and also with the electric current supplied from the power source, ringings are produced by the self inductance of the wiring line. The semiconductor devices of FIGS. 5(a) and 5(b) or 6(a) and 6(b) are disadvantageous in that, when the ringings are great, the power supply to the LSI becomes so unstable that the internal circuit 12 may malfunction. While operation of the semiconductor device is described in terms of the operation at a rising edge of the signal, an undershoot at a falling edge of the signal will cause ringings with the ground potential.

In order to eliminate or minimize the problem just described, the semiconductor device described hereinabove with reference to FIG. 7 is constructed such that the power source wiring line and the grounding wiring line for supplying the power source potential and the ground potential to the buffers 14a and 14b and the internal circuit 12 are separated from each other so that the potentials may be supplied in two separate circuits in order to prevent ringings on the power source side and the ground side from propagating to the internal circuit 12 so as to minimize the influence of them. It is difficult, however, to apply this countermeasure to such an arrangement wherein a power source wiring line and a grounding wiring line are separated into two circuits so that the number of pads which can be arranged for inputting and outputting signals is reduced and the terminals of the LSI which has a large number of terminals (for a large number of signals) can be used efficiently.

Further, in order to increase the number of available terminals, the arrangement of FIGS. 5(a) and 5(b) may be combined with the arrangement of FIG. 7. However, an influence of the self inductance which increases as the wiring line distance increases cannot be avoided.

Further, in the arrangement of FIG. 7, since a power source wiring line 17m and a grounding wiring line 17n for the internal circuit extending from the pads 13a and 13b extend perpendicularly to the power source wiring line ring 15a and the grounding wiring line ring 15b formed from the first conductive layer, a high mutual inductance is exhibited at each of the intersecting locations. Consequently, ringings of the power source wiring line ring 15a and the grounding wiring line ring 15b have an influence upon the power source wiring line 17m and the grounding wiring line 17n for the internal circuit 12. Accordingly, the initial effect that no ringing is allowed to propagate to the internal circuit 12 is reduced.

SUMMARY OF THE INVENTION

It is an object of the present invention to provide a semiconductor device in the form of an LSI having a large number of terminals wherein an increase of the number of pad terminals for a power source and the ground does not increase the inductances of wiring lines to the pad terminals.

It is another object of the present invention to provide a semiconductor device in the form of an LSI having a large number of terminals wherein the terminals are arranged efficiently.

In order to attain the objects described above, according to the present invention, there is provided a semiconductor device which comprises a semiconductor chip having an internal circuit formed in an internal circuit formation region on a semiconductor substrate, a support having a plurality of external lead terminals and having the semiconductor chip supported thereon, the semiconductor substrate further having a first pad arrangement region, a buffer arrangement region and a second pad arrangement region successively arranged in this order toward the outer edge of the internal circuit formation region thereon and arranged in parallel to each other, a power source wiring line and a grounding wiring line for an input/output buffer in the buffer arrangement region arranged in the buffer arrangement region, a first power source pad and a first grounding pad for the internal circuit provided in the first pad arrangement region, and a plurality of pads provided in the second pad region for inputting and/or outputting signals, the first power source pad, the first grounding pad and the plurality of pads being bonding connected to individual particular ones of the external lead terminals by respective thin metal lines.

Each of regions in which the first power source pad and the first grounding pad, as well as those of the external lead terminals which are connected to the first power source pad and the first grounding pad, are individually arranged may have a sufficient area to allow bonding connection using a plurality of thin metal lines.

The semiconductor device may further comprise second power source pad and a second grounding pad for the input/output buffer provided in the second pad arrangement region. In this instance, the first power source pad and the first grounding pad in the first pad arrangement region and the second power source pad and the second grounding pad in the second pad arrangement region may be arranged at a first pitch in each of the pad regions and arranged at a second pitch equal to one half the first pitch in a zigzag arrangement in both of the pad regions while also the corresponding ones of the external lead terminals are arranged at the second pitch.

Or, the semiconductor device may be constructed such that only the plurality of pads for inputting and/or outputting signals are provided in the second arrangement region while the first power source pad and the first grounding pad as well as a second power source pad and a second grounding pad for the input/output buffer are arranged in the first pad arrangement region, and the plurality of pads in the second pad arrangement region and the first power source pad and the first grounding pad as well as the second power source pad and the second grounding pad in the first pad arrangement region are arranged at a first pitch in each of the pad regions and arranged at a second pitch equal to one half the first pitch in a zigzag arrangement in both of the pad regions while also the corresponding ones of the external lead terminals are arranged at the second pitch.

In the semiconductor device, since the first pad arrangement region, in which the first power source pad and the first grounding pad for the internal circuit are arranged, is provided between the internal circuit formation region and the buffer arrangement region in which the buffers as well as a power source wiring line ring and a grounding wiring line ring are arranged, the self inductances of the thin metal lines which individually connect the first power source and grounding pads to the corresponding external lead terminals can be reduced thereby to reduce ringings. Further, since the thin metal lines for supplying the power source potential and the ground potential extend perpendicularly to the power source wiring line ring and the grounding wiring line ring, the mutual inductance between the thin metal lines is reduced. Furthermore, since the power source and grounding wiring lines for the internal circuit and the buffers are arranged alternately between the signal input/output pads of the pitch in the conventional semiconductor devices, the arrangement space for the external lead terminals, the pads for the internal circuit, the buffers which are conventionally arranged such that they extend from a peripheral portion of the semiconductor chip and the external lead terminal arrangement region can be omitted. The free space thus produced can be utilized as an arrangement space for the external lead terminals and the pads for input/output signals. Consequently, an efficient pad arrangement for an LSI having a large number of terminals can be provided.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

Figure 1A:
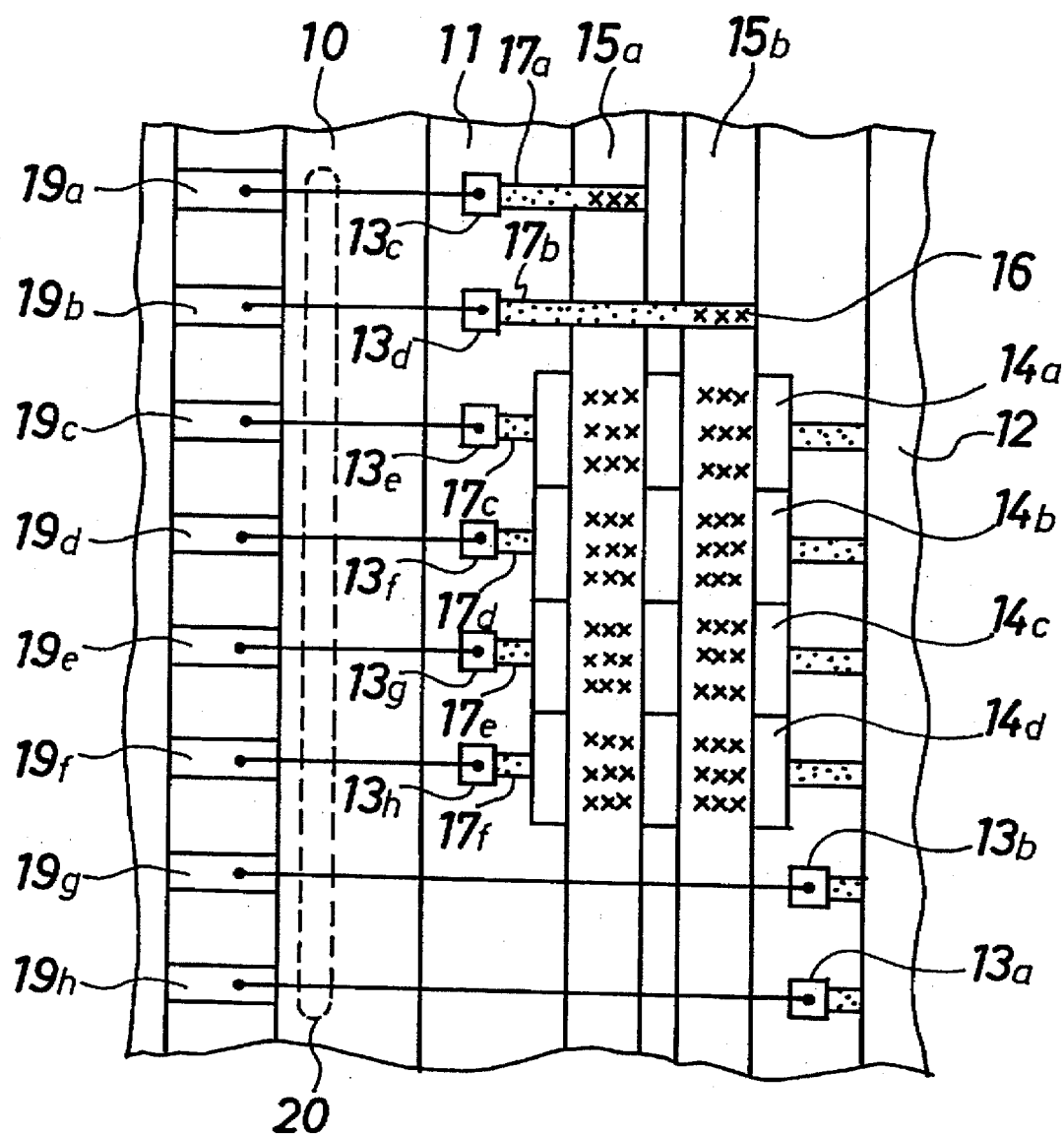
FIGS. 1(a) and 1(b) are schematic partial plan view and a schematic partial cross sectional view, respectively, of a semiconductor device to which the present invention is applied.
Figure 1:
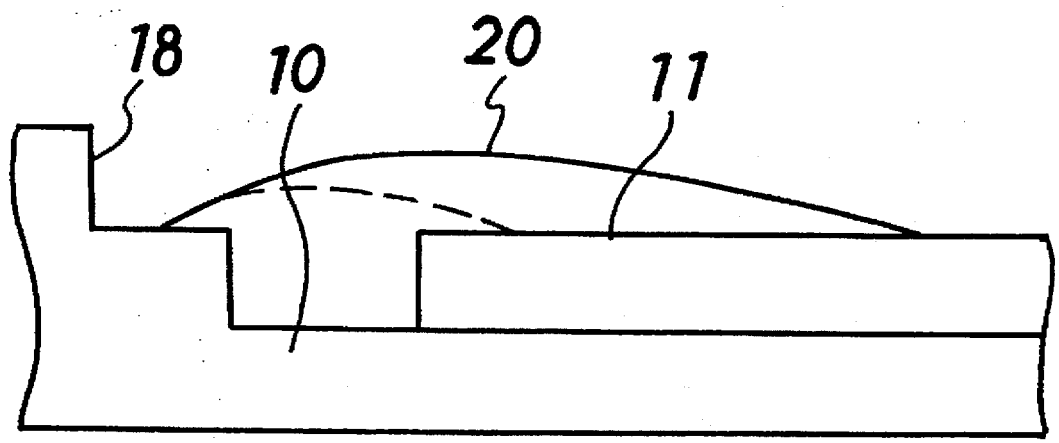

Referring first to FIGS. 1(a) and 1(b), there is shown a semiconductor device to which the present invention is applied. The semiconductor device shown includes a semiconductor chip 11 mounted on a support 10. The semiconductor chip 11 includes a substrate at a central portion of which an internal circuit formation region in which is arranged an internal circuit 12 is disposed. The substrate of the semiconductor chip 11 has, on a peripheral portion thereof on the outer side of the internal circuit formation region, a first pad arrangement region in which pads 13a and 13b for supplying a power source potential to the internal circuit 12 are arranged. On the outer side of the first pad arrangement area of the substrate, a buffer arrangement region in which input, output or input/output buffers 14a to 14d for inputting and/or outputting signals to the internal circuit 12 are arranged and, above the buffers 14a to 14d, a power source wiring line ring 15a formed from a first conductive layer for supplying a power source potential to the buffers 14a to 14d and a grounding wiring line ring 15b for supplying a ground potential to the buffers 14a to 14d are arranged in parallel to the first pad arrangement region.

The buffers 14a to 14d are connected to the power source wiring line ring 15a and the grounding wiring line ring 15b through via-holes by contacts 16 (each indicated by the mark x in FIG. 1(a)).

Further, on the outer side of the buffer arrangement region of the substrate, a second pad arrangement region is arranged in parallel to the first pad arrangement region. In the second arrangement region, all pads other than the pads 13a and 13b for supplying the power source potential and the ground potential to the internal circuit 12, that is, pads 13c and 13d to which wiring lines 17a and 17b of the second conductive layer for connection to the power source wiring line ring 15a and the grounding wiring line ring 15b are connected, respectively, and pads 13e to 13h to which terminals of the buffers 14a to 14d are connected, respectively, are arranged.

The pads 13e to 13h are connected to the buffers 14a to 14d by wiring lines 17c to 17f formed from the second conductive layer, respectively, and the output terminals of the buffers 14a to 14d are connected to the internal circuit 12 by wiring lines of the second conductive layer.

Meanwhile, the support 10 has a recessed portion 18 formed thereon such that it is opened as seen in FIG. 1(b), and external lead terminals 19a to 19h are arranged on the recessed portion 18. Of the external lead terminals 19a to 19h, the external lead terminals 19h and 19g are bonding connected to the power source pad 13a and the grounding pad 13b, which are connected to the internal circuit 12, by thin metal lines 20, respectively. Similarly, the pads 13e to 13h are bonding connected to the other external lead terminals 19c to 19f, respectively, by individual thin metal lines 20.

In the semiconductor device of the construction described above, since those thin metal lines 20 are bonding connected to the power source pad 13a and the grounding pad 13b which are connected to the internal circuit 12 and the external lead terminals 19h and 19g are wired across the second pad arrangement region and the buffer arrangement region, they are longer than those of the conventional semiconductor devices and exhibit higher self inductances.

However, as described hereinabove, since electric current flows steadily to some degree through the internal circuit 12 which is connected by those wiring lines, the variation in electric current with respect to time is small, and also production of ringings by the self inductances is reduced. Consequently, the influence of ringings is little.

Meanwhile, since the wiring lines for connecting the power source pad 13a and the grounding pad 13b, which are connected to the internal circuit 12, to the external lead terminals 19h and 19g are not wiring lines formed from the second conductive layer but are thin metal lines (20) which extend perpendicularly to and across the power source wiring line ring 15a and the grounding wiring line ring 15b, the mutual inductance of them can be reduced almost to a zero level. Consequently, ringing of the power source wiring line ring 15a and the grounding wiring line ring 15b which are produced by high current flowing to the buffers can be prevented from having an influence on the internal circuit 12 via the metal wiring lines.

In particular, internal wiring lines of the semiconductor chip 11, for example, the second conductive layer wiring lines 17a and 17b and the first conductive layer wiring lines 15a and 15b, are spaced away from each other only by a distance equal to the thickness of an interposed inter-layer insulation film (in this instance, approximately 1μm). In contrast, where the thin metal lines 20 are employed and arranged in a crossing manner, since they are arranged by stretching metal wires mechanically, the distance between the thin metal lines 20 and the first conductive layer wiring lines (power source and grounding wiring line rings) 15a and 15b ranges approximately from 10 μm to 1 mm. Accordingly, the mutual inductances are reduced to 1/10 to 1/1,000 comparing with those by the intersecting wiring lines formed from the first and second conductive layers. Consequently, the influence of the mutual conductances can be ignored.

Figure 2:
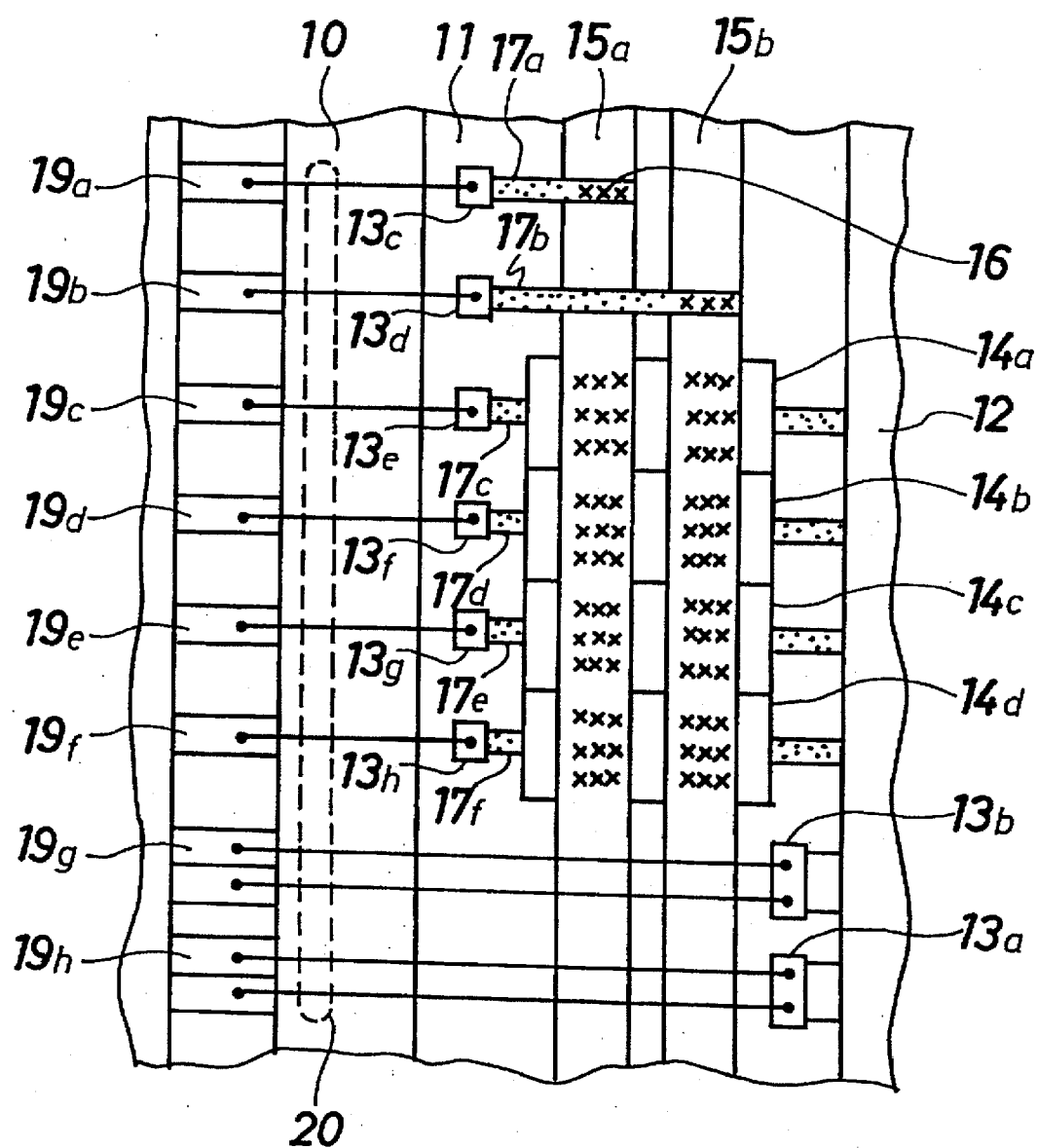
FIG. 2 is a schematic partial plan view of another semiconductor device to which the present invention is applied.

Referring now to FIG. 2, there is shown in plan view another semiconductor device to which the present invention is applied. The semiconductor device of the present embodiment is a modification to and has a common construction with the semiconductor device of the first embodiment of FIGS. 1(a) and 1(b), and overlapping description of the common construction is omitted here to avoid redundancy. The semiconductor device of the present embodiment is different from the semiconductor device of the first embodiment principally in that the width of the second conductive layer wiring lines 17f and 17g for supplying a power source potential and a ground potential to the internal circuit 12, the areas of the pads 13a and 13b for connection of wiring lines and the external lead terminals 19g and 19h corresponding to them are individually expanded to a plurality of times those of the semiconductor device of the first embodiment, for example, to twice, and those thin metal lines 20 for interconnecting them are bonding connected for each two lines.

With the semiconductor device of the construction described above, a possible influence of the self inductances caused by the thin metal lines of an increased length between the external lead terminals for the power source and ground potentials for the internal circuit in the semiconductor device of the first embodiment and the pads 13a and 13b can be further reduced.

In particular, the value of a composite inductances of a plurality of inductances can be reduced by connecting the inductance elements in parallel. For example, if two wiring lines having an equal inductance value are connected in parallel, then the value of the composite inductance is reduced to one half the original value.

Making use of the characteristic of the composite inductance, the areas of the power source pad 13a and the grounding pad 13b connected to the internal circuit 12 and the corresponding external lead terminals 19a and 19b are expanded and two thin metal lines are connected in parallel per one pad, thereby reducing the composite inductance.

Figure 3:
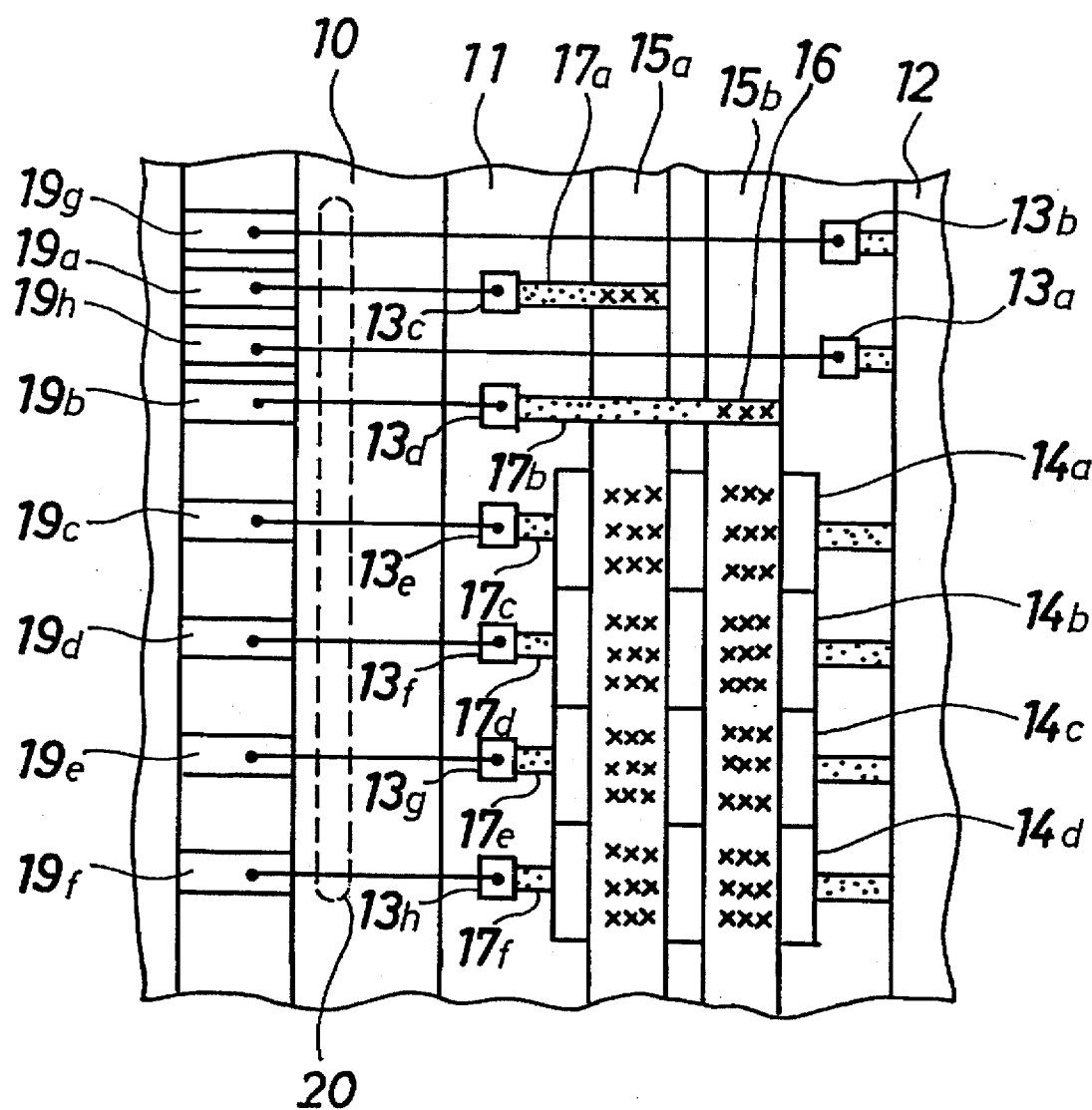
FIGS. 3 and 4 similar views but showing different semiconductor devices to which the present invention is applied.

Referring now to FIG. 3, there is shown in plan view a further semiconductor device to which the present invention is applied. The semiconductor device of the present embodiment is a modification to and has a common construction with the semiconductor device of the first embodiment of FIGS. 1(a) and 1(b), and overlapping description of the common construction is omitted here to avoid redundancy. The semiconductor device of the present embodiment is different from the semiconductor device of the first embodiment principally in that thin metal lines between the external lead terminals 19g and 19h for the power source potential and the ground potential for the internal circuit and the pads 13a and 13b are arranged alternately with thin metal lines between the external lead terminals 19a and 19b for the power source potential and the ground potential for the buffers and the pads 13c and 13d. In addition, the pads 13c, 13d and 13a, 13b are arranged in a zigzag pattern across the power source wiring line ring 15a and the grounding wiring line ring 15b, and the arrangement pitches of the external lead terminals and the thin metal lines are reduced to ½ those in the first described semiconductor device.

In the two preceding semiconductor devices of the first and second embodiments, the pads are arranged in a similar spaced relationship as in the conventional semiconductor device described hereinabove. Accordingly, the semiconductor devices do not provide an efficient arrangement for increase in number of terminals of an LSI. The semiconductor device of FIG. 3 thus provides a more efficient pad arrangement.

In particular, since the external lead terminals and the pads for the power source potential and the ground potential for the internal circuit in the semiconductor devices of the first and second embodiments are arranged between the power source pad and the grounding pad for the buffers, the arrangement space for the external lead terminals and the pads for the power source potential and the ground potential for the internal circuit which are conventionally arranged such that they extend from a peripheral portion of the semiconductor chip 11 and the external lead terminal arrangement region can be omitted, and the free space thus produced can be utilized as an arrangement space for the external lead terminals and the pads for input/output signals.

It is to be noted that, also in the semiconductor device of the third embodiment, paired thin metal lines can be wired similarly as in the semiconductor device of the second embodiment. In this instance, although the space in which the area of the pads 13a and 13b is expanded has no problem since it has a sufficient margin, for the arrangement space for the external lead terminals 19g and 19h, an increased space for allowing an expansion of the same from that of the semiconductor device of the present embodiment is required.

Further, in the semiconductor device of the third embodiment, since the thin metal lines 20 connected to the power source pad 13a and the grounding pad 13b cross over the power source wiring line ring 15a and the grounding wiring line ring 15b, the mutual inductance of them can be reduced almost to the zero level, and an influence of ringings can be eliminated.

Figure 4:
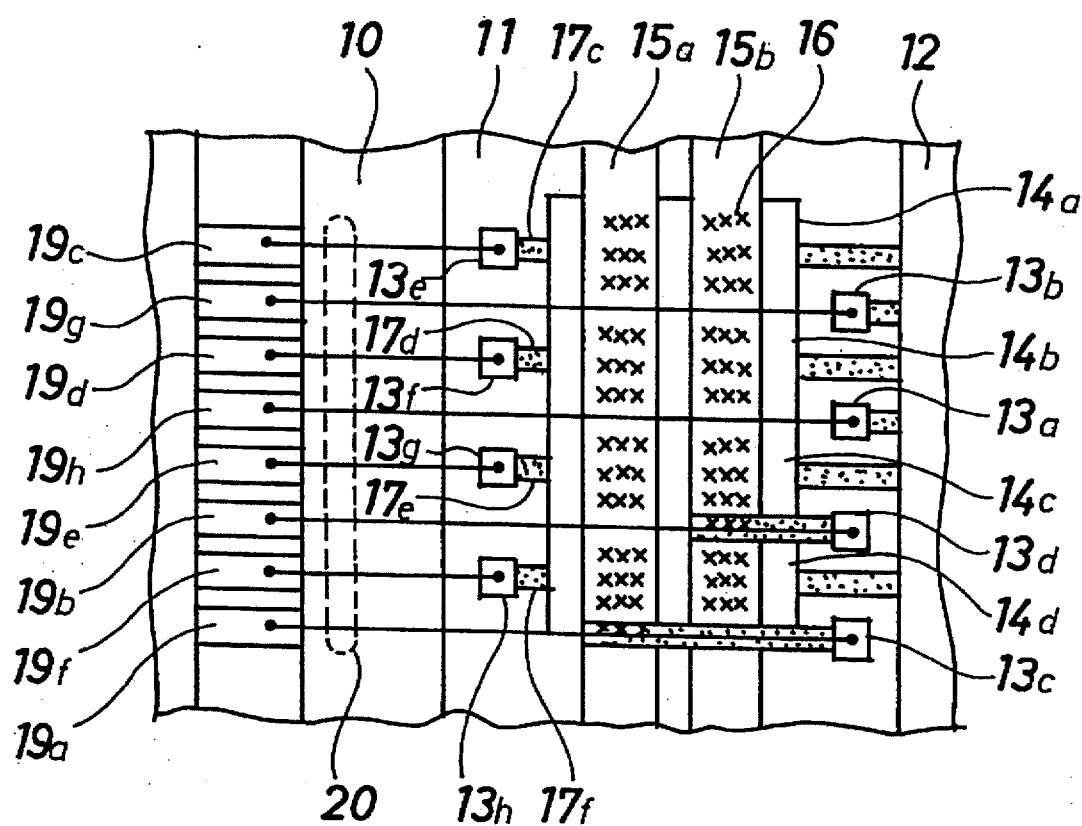
Figure 5A:
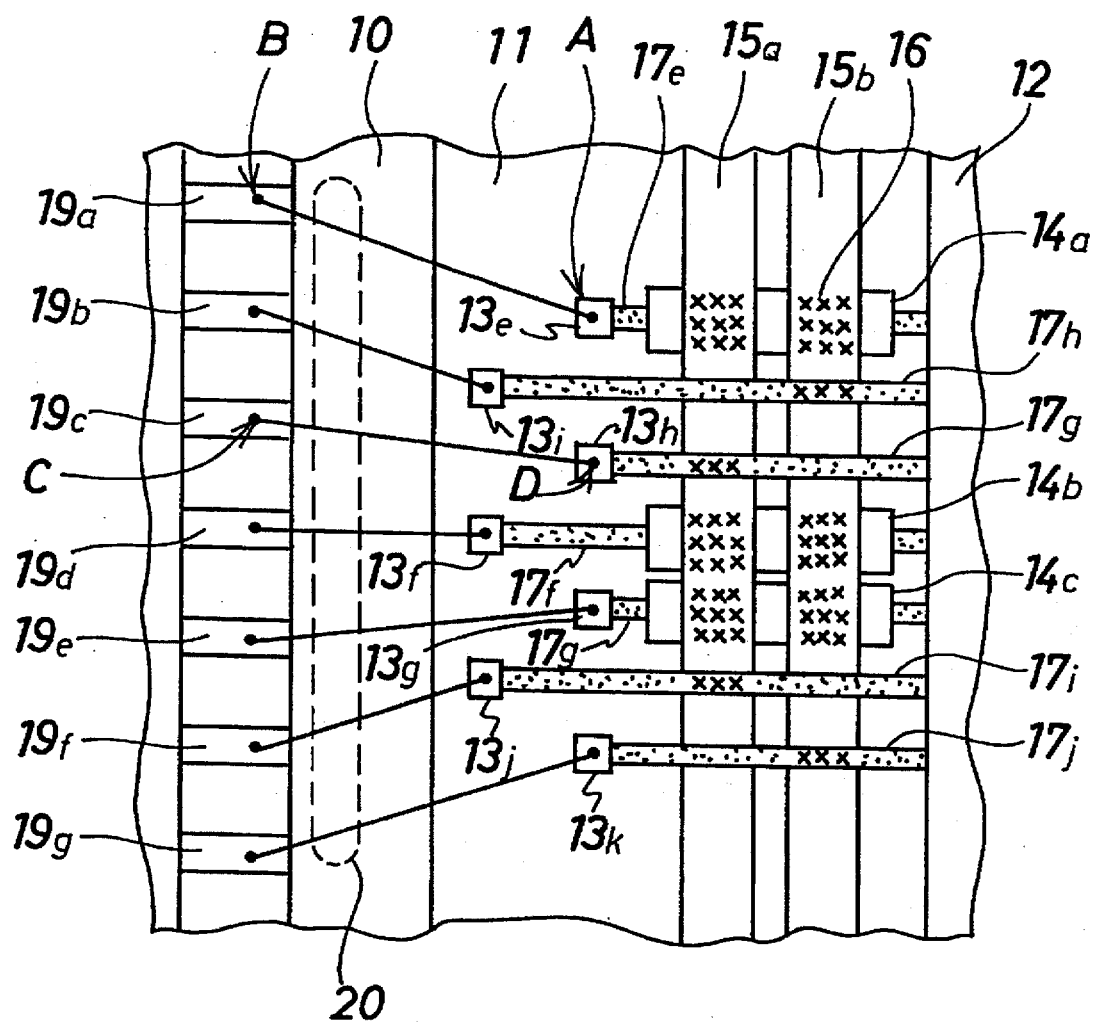
FIGS. 5(a) and 5(b) are a schematic partial plan view and a schematic partial process sectional view, respectively, of a conventional semiconductor device.
Figure 5B:
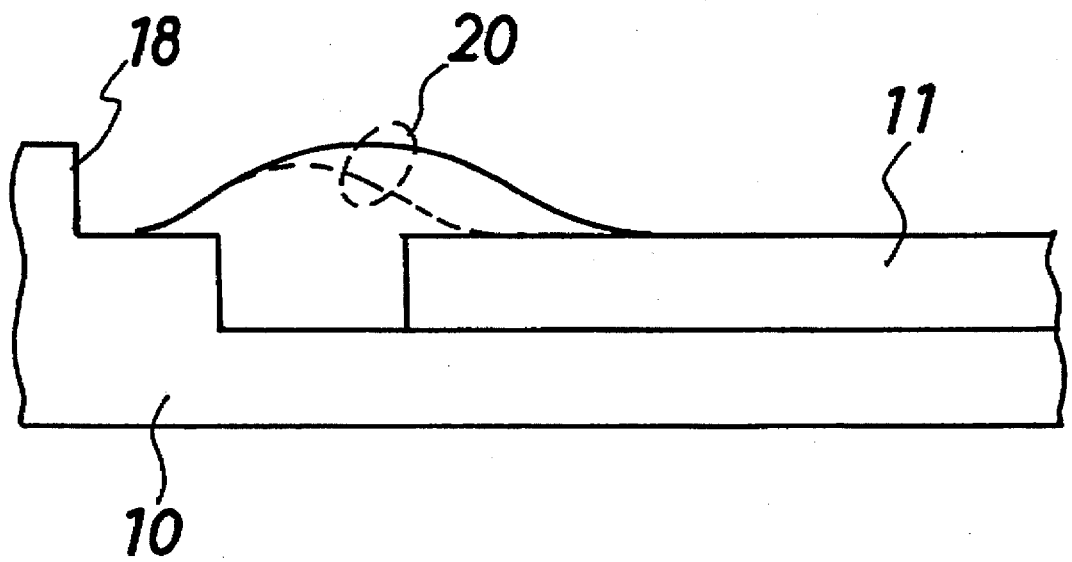
Figure 6A:
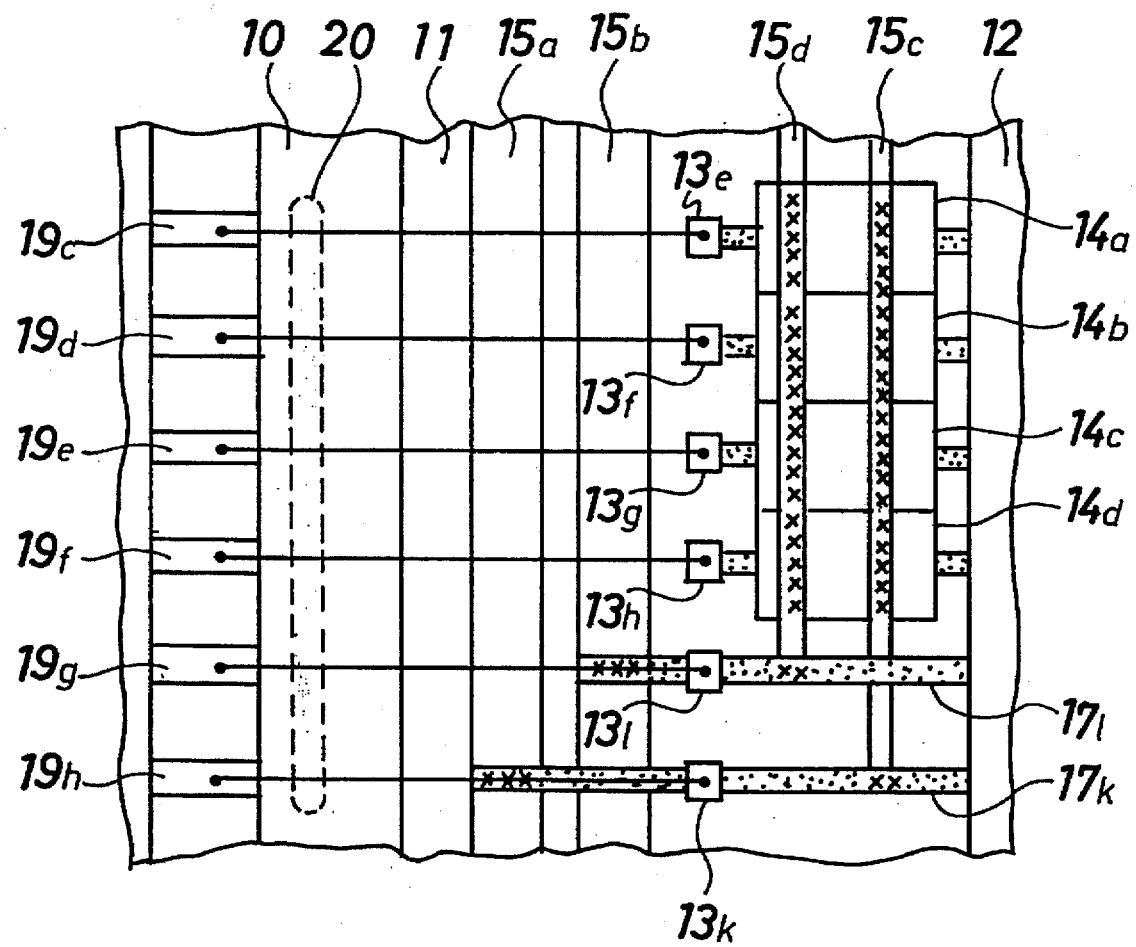
FIGS. 6(a), and 6(b) are a schematic partial plan view and a schematic partial process sectional view, respectively, of another conventional semiconductor device.
Figure 6B:
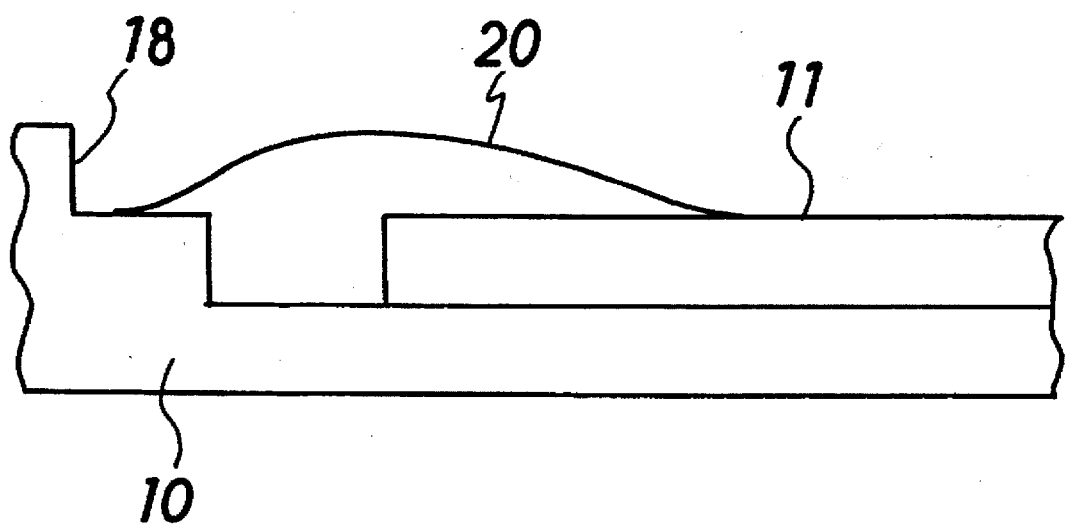
Figure 7:
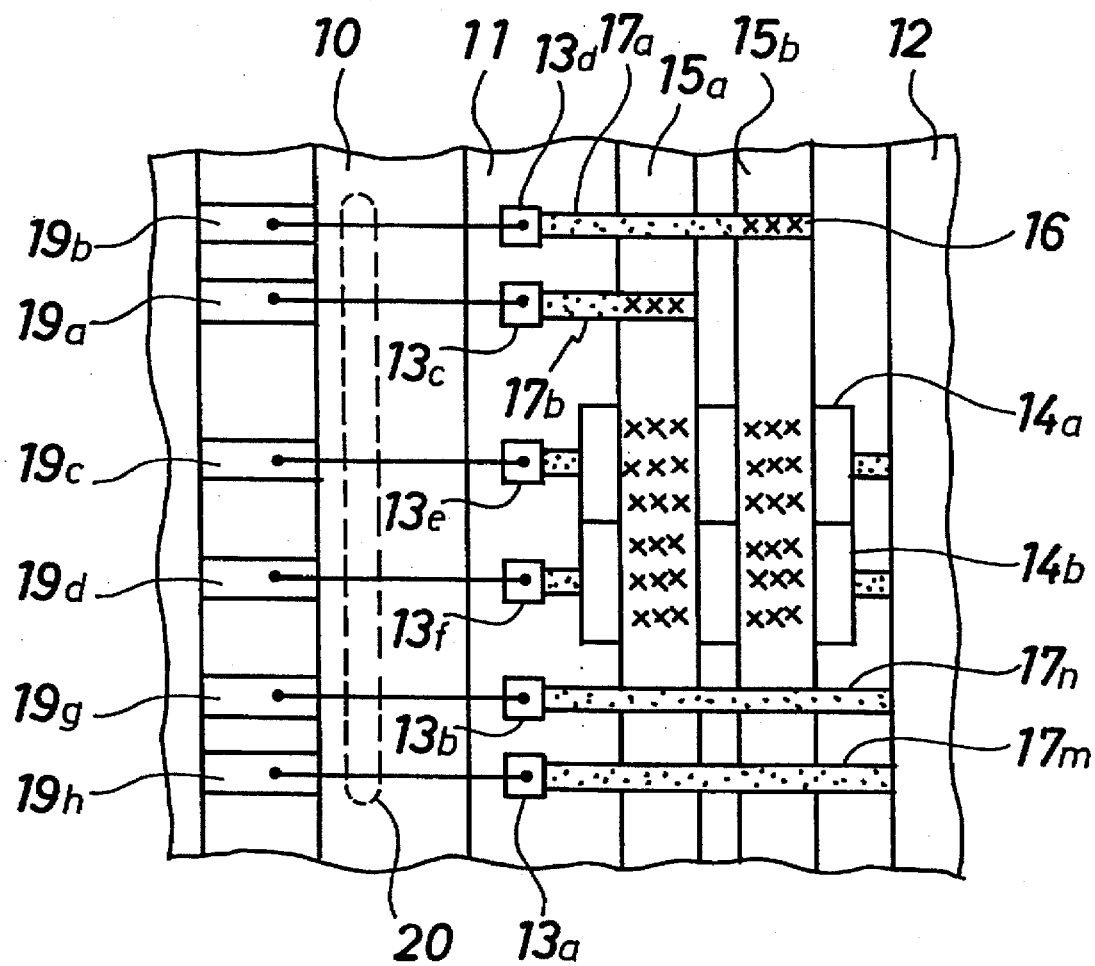
FIG. 7 is are a schematic partial plan view of a further conventional semiconductor device.
Figure 8:
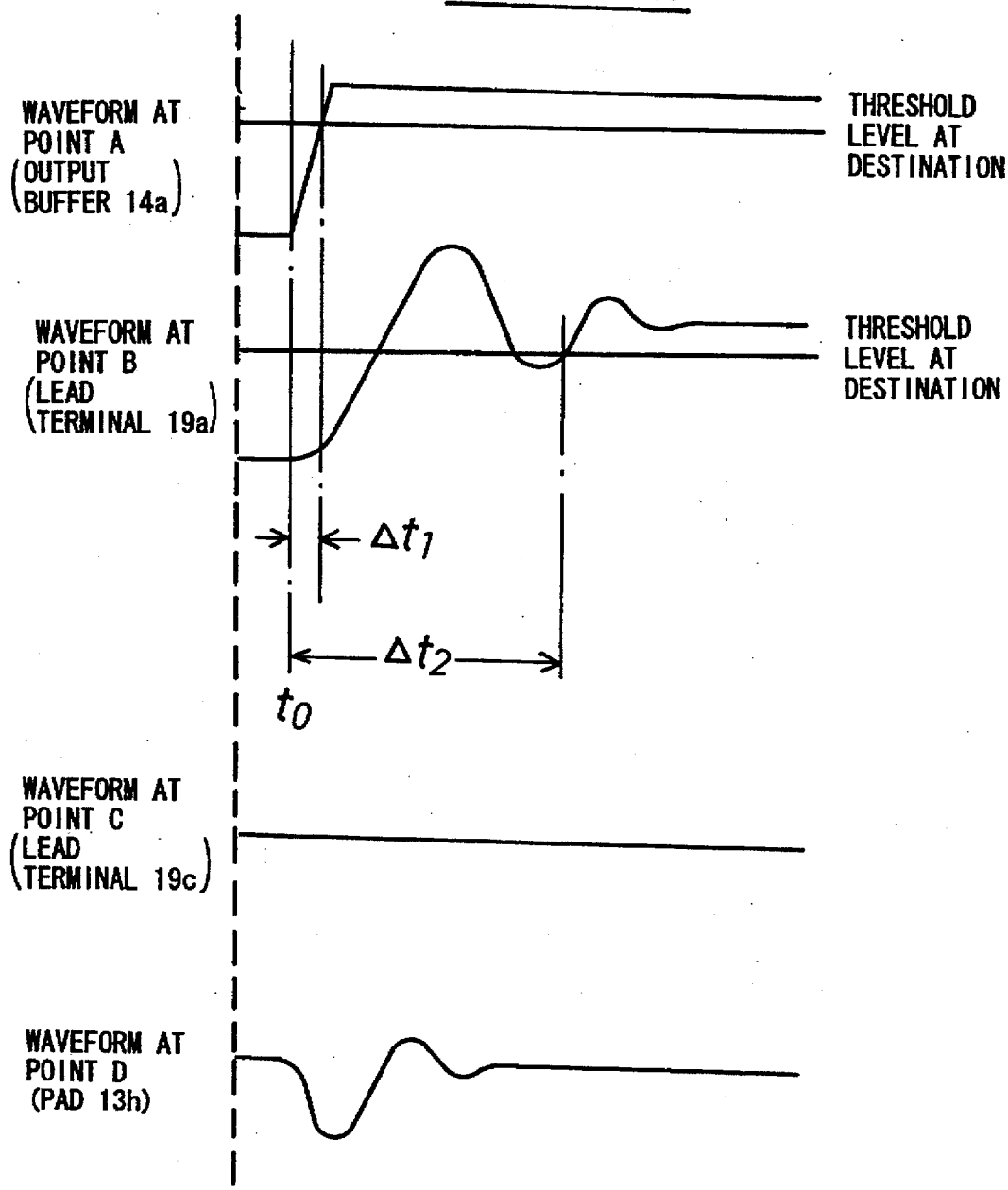
FIG. 8 is a waveform diagram illustrating a signal delay in t conventional semiconductor devices

Referring now to FIG. 4, there is shown in plan view a still further semiconductor device to which the present invention is applied. The present semiconductor device includes a semiconductor chip 11 carried on a support 10. The semiconductor chip 11 has an internal circuit region at a central portion of which an internal circuit 12 is arranged, and a power source pad region on the outer side of the internal circuit region. In the power source pad region, a pair of pads 13a and 13b for supplying a power source potential and a ground potential to the internal circuit 12 and a pair of pads 13c and 13d for supplying a power source potential and a ground potential to buffers 14a to 14d are arranged. On the further outer side of the power source pad region, a buffer arrangement region is provided in which the buffers 14a to 14c are arranged and, above the buffers 14a to 14c, a power source wiring line ring 15a formed from a first conductive layer for supplying the power source potential to the buffers 14a to 14c and a grounding wiring line ring 15b for supplying a grounding potential to the buffers 14a to 14c are arranged and connected through via-holes.

Further, a pad arrangement region in which all pads other than the pads for supplying the power source potentials and the grounding potentials described above, that is, pads 13e to 13h to which the buffers 14a to 14d are connected, respectively, is provided on the outer side of the buffer arrangement region. The pads 13e to 13h and the buffers 14a to 14d are connected to each other by wiring lines 17c to 17f formed from a second conductive layer, respectively, and the outputs of the buffers 14a to 14d are connected to the internal circuit 12 similarly by wiring lines of the second conductive layer.

Furthermore, on the outside of the semiconductor chip 11, external lead terminals 19a to 19f are disposed on an end face of a recessed portion opened to the support 10. The arrangement pitch of the external lead terminals 19a to 19f, however, is, similarly to the pitch of the power source and grounding pads in the semiconductor device of the third embodiment, equal to one half the arrangement pitch of the conventional semiconductor device.

Further, while the pad arrangement pitch in the pad arrangement region for the buffers and the pad arrangement pitch in the power source pad region are similar to those of the conventional semiconductor device, the pads of the power source pad region are arranged alternately between the pads of the pad arrangement region, and besides, the pads of the pad arrangement region and the pads of the power source arrangement region are arranged in a zigzag pattern.

The pads and the external lead terminals are bonding connected by the individual metal wiring lines. Naturally, however, the wiring lines for the pads of the pad arrangement region are longer than the wiring lines for the pads of the power source pad region. It is to be noted that the pads 13c and 13d are connected to the power source wiring line ring 15a and the grounding wiring line ring 15b, respectively, by wiring lines of the second conductive layer.

While, in the pads for the buffers in the semiconductor device of the third embodiment are arranged in a mixed condition with the signal input/output pads in the pad arrangement region at similar pad distances to those in the conventional semiconductor devices described hereinabove, the semiconductor device of the fourth embodiment provides a further efficient pad arrangement for increase in number of terminals of an LSI.

In particular, since the power source and grounding metal wiring lines for the internal circuit and the buffers are arranged alternately between the signal input/output pads of the pitch in the conventional semiconductor device, the arrangement space for the external lead terminals and the pads for the internal circuit and the buffers which are conventionally arranged such that they extend from a peripheral portion of the semiconductor chip 11 and the external lead terminal arrangement region can be omitted, and the free space thus produced can be utilized as an arrangement space for the external lead terminals and the pads for input/output signals. Consequently, an efficient pad arrangement for an LSI having a large number of terminals can be provided.

It is to be noted that, also in the semiconductor device of the fourth embodiment, since the thin metal lines 20 to which the power source and grounding pads 13a and 13b connected to the internal circuit 12 and the power source and grounding pads 13c and 13d for the buffers cross over the power source wiring line ring 15a and the grounding wiring line ring 15b, the mutual inductance of them can be reduced almost to the zero level, and an influence of ringings can be eliminated.

Having now fully described the invention, it will be apparent to one of ordinary skill in the art that many changes and modifications can be made thereto without departing from the spirit and scope of the invention as set forth herein.

What is claimed is:

1. A semiconductor device, comprising:
    a semiconductor chip having an internal circuit formed in an internal circuit formation region on a semiconductor substrate of said semiconductor chip;
    a support having external lead terminals and having said semiconductor chip supported thereon;

said semiconductor substrate further comprising a first pad arrangement region, a buffer arrangement region and a second pad arrangement region successively arranged towards an outer edge of said internal circuit formation region;

a power source wiring line and a grounding wiring line for an input/output buffer in said buffer arrangement region arranged in said buffer arrangement region;

a first power source pad and a first grounding pad for said internal circuit provided in said first pad arrangement region; and a plurality of pads provided in said second pad arrangement region for inputting and outputting signals;

said first power source pad and said first grounding pad each being connected to a respective one of said external lead terminals by at least one thin metal line which passes over said buffer arrangement region.

2. A semiconductor device as claimed in claim 1, wherein said first power source pad and said first grounding pad are each connected to said respective one of said external lead terminals using at least two of said thin metal lines.

3. A semiconductor device as claimed in claim 1, further comprising a second power source pad and a second grounding pad for said input/output buffer, said second power source pad and said second grounding pad each being arranged in said second pad arrangement region and connected to a respective one of said external lead terminals using at least one thin metal line.

4. A semiconductor device as claimed in claim 3, wherein said first power source pad and said first grounding pad are arranged in said first pad arrangement region at a first pitch, wherein said second power source pad and said second grounding pad are arranged in said second pad arrangement region at said first pitch; said second power source pad and said second grounding pad being arranged in a zigzag pattern with respect to said first power source pad and said first grounding pad at a second pitch equal to one half the first pitch; and wherein said external lead terminals are arranged in said support at said second pitch.

5. A semiconductor device as claimed in claim 1, wherein only said plurality of pads for inputting and outputting signals are provided in said second pad arrangement region while said first power source pad and said first grounding pad as well as a second power source pad and a second grounding pad for said input/output buffer are arranged in said first pad arrangement region;

wherein said plurality of pads are arranged at a first pitch in said second pad arrangement region;

wherein said first power source pad, said first grounding pad, said second power source pad and said second grounding pad are arranged at said first pitch in said first pad arrangement region, and are arranged in a zigzag pattern with respect to said plurality of pads in second pad arrangement region at a second pitch equal to one half said first pitch; and wherein said external lead terminals are arranged at said second pitch in said support.

* * * * *